(12) United States Patent
Shoji et al.

(10) Patent No.: US 8,525,132 B2
(45) Date of Patent: Sep. 3, 2013

(54) FLAT PANEL DETECTOR

(75) Inventors: Takehiko Shoji, Tokyo (JP); Mika Sakai, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 12/675,154

(22) PCT Filed: Sep. 3, 2008

(86) PCT No.: PCT/JP2008/065856
§ 371 (c)(1), (2), (4) Date: Feb. 25, 2010

(87) PCT Pub. No.: WO2009/031574
PCT Pub. Date: Mar. 12, 2009

(65) Prior Publication Data
US 2010/0243908 A1    Sep. 30, 2010

(30) Foreign Application Priority Data
Sep. 6, 2007 (JP) .................................. 2007-231259

(51) Int. Cl.
G01T 1/20 (2006.01)
(52) U.S. Cl.
USPC ................................... 250/472.1; 250/361 R
(58) Field of Classification Search
None
See application file for complete search history.

(56) References Cited

U.S. PATENT DOCUMENTS

| | | | |
|---|---|---|---|
| 2,382,736 A * | 8/1945 | Mason | 40/638 |
| 2004/0195514 A1 * | 10/2004 | Nagano | 250/370.11 |
| 2005/0051735 A1 * | 3/2005 | Tazaki | 250/484.4 |
| 2007/0051896 A1 * | 3/2007 | Okada et al. | 250/370.11 |

FOREIGN PATENT DOCUMENTS

| | | |
|---|---|---|
| JP | 11-160442 | 6/1999 |
| JP | 11-274448 | 10/1999 |
| JP | 2000009845 | 1/2000 |
| JP | 2002-055165 | 2/2002 |
| JP | 2006-220439 A | 11/2002 |
| JP | 3566926 | 9/2004 |
| JP | 2004-309169 | 11/2004 |
| JP | 2005-172511 | 6/2005 |
| JP | 2005-181121 | 7/2005 |
| JP | 2006-184187 | 7/2006 |
| JP | 2006189377 | 7/2006 |
| JP | 2002-341039 A | 8/2006 |

(Continued)

OTHER PUBLICATIONS

English translation of JP publication 2006-1848187, which was published Jul. 13, 2006.*
Office Action from Japanese Patent Office dated May 31, 2011 for Patent Application No. 2009-531257.

(Continued)

*Primary Examiner* — David Porta
*Assistant Examiner* — Carolyn Igyarto
(74) *Attorney, Agent, or Firm* — Lucas & Mercanti, LLP

(57) ABSTRACT

Provided is a flat panel detector which prevents aging deterioration of characteristics of a phosphor layer, protects the phosphor layer from chemical alteration or physical impact, and maintains a stable contact state between a scintillator panel and a flat light receiving element. Disclosed is a flat panel detector comprising a scintillator panel comprising a scintillator provided with a phosphor layer on a substrate and a protective layer covering the phosphor surface of the scintillator, and the scintillator panel being placed on the surface of a flat light receiving element comprising plural picture elements which are two-dimensionally arranged, wherein a releasable adhesive layer is provided on the protective layer surface.

9 Claims, 1 Drawing Sheet

(56) References Cited

FOREIGN PATENT DOCUMENTS

| JP | 2006-337184 A | 12/2006 |
|----|---------------|---------|
| JP | 2011-186902   | 9/2011  |
| JP | 2012-008141   | 1/2012  |

OTHER PUBLICATIONS

English language translation of Office Action from Japanese Patent Office ("Notice of Reasons for Refusal") dated May 31, 2011 for Patent Application No. 2009-531257.

Japanese Office Action Mailing No. 072490, date mailed Feb. 7, 2012 (3 pages) and English translation thereof (4 pages).

Japanese and English translation of Notice of Reasons for Refusal, Patent Application No. 2012-087290, date of drafting Aug. 23, 2012.

Japanese and English Decision of Rejection of Amendment, Patent Application No. 2012-087290, date of drafting Mar. 15, 2013.

Japanese and English Decision of Refusal, Patent Application No. 2012-087290, date of drafting Mar. 15, 2013.

* cited by examiner

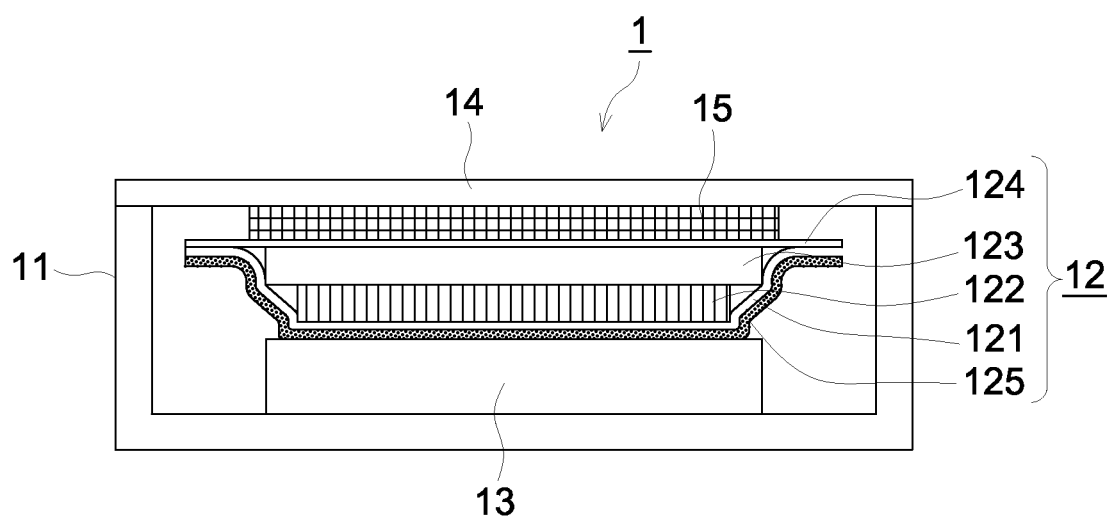

FLAT PANEL DETECTOR

CROSS REFERENCE TO RELATED APPLICATIONS

This is a U.S. National Phase Application under 35 U.S.C. 371 of International Application PCT/JP2008/065856, filed Sep. 3, 2008, which claims the priority of Japanese Application No. 2007-231259, filed Sep. 6, 2007, the entire contents of both Applications are hereby incorporated by reference.

TECHNICAL BACKGROUND

The present invention relates to a flat panel detector provided with a scintillator panel with a state of the scintillator panel being excellently in contact with a flat light receiving element.

TECHNICAL BACKGROUND

There have been broadly employed radiographic images such as X-ray images for diagnosis of the conditions of patients on the wards. Specifically, radiographic images using an intensifying-screen/film system have achieved enhancement of speed and image quality over its long history and are still used on the scene of medical treatment as an imaging system having high reliability and superior cost performance in combination. However, these image data are so-called analog image data, in which free image processing or instantaneous image transfer cannot be realized.

Recently, there appeared digital system radiographic image detection apparatuses, as typified by a computed radiography (also denoted simply as CR) and a flat panel detector (also denoted simply as FPD). In these apparatuses, digital radiographic images are obtained directly and can be displayed on an image display apparatus such as a cathode tube or liquid crystal panels, which renders it unnecessary to form images on photographic film. Accordingly, digital system radiographic image detection apparatuses have resulted in reduced necessities of image formation by a silver salt photographic system and leading to drastic improvement in convenience for diagnosis in hospitals or medical clinics.

The computed radiography (CR) as one of the digital technologies for radiographic imaging has been accepted mainly at medical sites. However, image sharpness is insufficient and spatial resolution is also insufficient, which have not yet reached the image quality level of the conventional screen/film system. Further, there appeared, as a digital X-ray imaging technology, an X-ray flat panel detector (FPD) using a thin film transistor (TFT), as described in, for example, the article "Amorphous Semiconductor Usher in Digital X-ray Imaging" described in Physics Today, November, 1997, page 24 and also in the article "Development of a High Resolution, Active Matrix, Flat-Panel Imager with Enhanced Fill Factor" described in SPIE, vol. 32, page 2 (1997).

To convert radiation to visible light is employed a scintillator panel made of an X-ray phosphor which is emissive for radiation. The use of a scintillator panel exhibiting enhanced emission efficiency is necessary for enhancement of the SN ratio in radiography at a relatively low dose. Generally, the emission efficiency of a scintillator panel depends of the phosphor layer thickness and X-ray absorbance of the phosphor. A thicker phosphor layer causes more scattering of emission within the phosphor layer, leading to deteriorated sharpness. Accordingly, necessary sharpness for desired image quality level necessarily determines the layer thickness.

Specifically, cesium iodide (CsI) exhibits a relatively high conversion rate of from X-rays to visible light. Further, a columnar crystal structure of the phosphor can readily be formed through vapor deposition and its light guide effect inhibits scattering of emitted light within the crystal, enabling an increase of the phosphor layer thickness. However, the use of CsI alone results in reduced emission efficiency. For example, JP-B 54-35060 (hereinafter, the term JP-B refers to Japanese Patent Publication) disclosed a technique for use as an X-ray phosphor in which a mixture of CsI and sodium iodide (NaI) at any mixing ratio was deposited on a substrate to form sodium-activated cesium iodide (CsI:Na), which was further subjected to annealing as a post-treatment to achieve enhanced visible-conversion efficiency.

However, a scintillator (phosphor layer) based on CsI exhibits deliquescence and suffered a disadvantage of characteristics being deteriorated with aging. Accordingly, to prevent such deterioration with aging, there is proposed formation of a moisture-proof protective layer provided on the surface of the scintillator (phosphor layer) based on CsI. For instance, there is known a technique in which the upper portion and the side portion of a scintillator layer (corresponding to a phosphor layer of the present invention) and the circumferential portion of the scintillator layer on a substrate are covered with a poly-p-xylilene resin (as described in, for example, patent document 1). There is also known a technique of covering at least the opposite side of a scintillator layer to the side opposing to the support and a side surface with a transparent resin film exhibiting a moisture permeability of less than 1.2 g/m$^2$·day (as described in, for example, patent document 2). Enhanced moisture-proofing is achieved by these protective layers.

Generally, in cases when placing a scintillator panel on a flat light receiving element, a cushioning material is provided between the protective cover and the scintillator panel, and the scintillator panel is pressed at an optimal pressure onto the light receiving element through the pressure of the compressed cushioning material when the protective cover is provided. Accordingly, when assembling a flat panel, a scintillator panel and a cushioning material are sequentially placed on a light receiving element disposed in a housing and thereafter, a protective cover is fixed to the housing by screws or the like.

In this case, excessively strong pressure of the cushioning material breaks the top portion of phosphor crystals having a columnar crystal structure, resulting in lowered contrast of a radiation image. To the contrary, in cases of a weak pressure of the cushioning material, a displacement between the scintillator panel surface and the flat light receiving element surface is caused when turning the FPD downward or by vibration, resulting in reduced signal correction precision at the individual elements of a flat light receiving element and leading to deteriorated graininess or sharpness of the obtained image. There is also produced problems such that friction between a scintillator panel and a flat light receiving element, caused by movement or vibration of the FPD, tends to produce defects in the flat light receiving element or the phosphor layer.

In general, the thickness of a phosphor layer needs to be not less than 400 μm to obtain a radiation image of enhanced graininess; however, the increased mass of the scintillator panel, due to such an increased layer thickness or an increased panel size has pronounced the foregoing problems.

To overcome such problems, there has been proposed a method of securing a scintillator panel and a flat light receiving element with an adhesive (as described in, for example, patent document 1) or a method of pasting them together with a matching oil (as described in, for example, patent document 2), but producing problems such as occurrence of unevenness due to the adhesive or the matching oil, or the increased number of work steps. Further, overhaul of a FDP or replacement of a scintillator panel is impossible in these methods, producing serious problems in maintenance.

Production of scintillator plates through a gas phase method were generally conducted by forming a scintillator layer on a rigid substrate such as aluminum or amorphous carbon and covering the entire surface of the scintillator layer with a protective layer (as described in Japanese Patent No. 3566926). However, formation of a scintillator layer on a substrate which cannot be freely bent is easily affected by deformation of the substrate or curvature at the time of vapor deposition when sticking a scintillator plate on the flat light-receiving element surface with paste, leading to defects such that uniform image quality characteristics cannot be achieved with the flat light-receiving surface of a flat panel detector. Accordingly, such problems have become serious along with the recent trend of increasingly larger flat panel detectors.

To avoid these problems was generally performed formation of a scintillator directly on an imaging device through vapor deposition or the use of a medical intensifying screen exhibiting flexibility but low sharpness instead of a scintillator.

In view of the foregoing situation, there has been desired development of a radiation flat panel detector which is suitable for production, prevents aging deterioration of characteristics of the phosphor layer, protects the phosphor layer from chemical alteration or physical impact and maintains the stable contact state between the scintillator panel and the flat light receiving element.

Patent document 1: JP 2006-189377 A
Patent document 2: JP 2000-9845 A

DISCLOSURE OF THE INVENTION

Problem to be Solved

The present invention has come into being in view of the foregoing problems, and it is an object of the invention to provide a flat panel detector which prevents aging deterioration of characteristics of a phosphor layer, protects the phosphor layer from chemical alteration or physical impact, and maintains a stable contact state between a scintillator panel and a flat light receiving element.

Means for Solving the Problems

The foregoing problems can be overcome by the following constitution:

1. A flat panel detector comprising a scintillator panel comprising a scintillator provided with a phosphor layer on a substrate and a protective layer covering the phosphor surface of the scintillator, and the scintillator panel being placed on the surface of a flat light receiving element comprising plural picture elements which are two-dimensionally arranged, wherein a releasable adhesive layer is provided on the protective layer surface.

2. The flat panel detector, as described in the foregoing 1, wherein the releasable adhesive layer exhibits an adhesive force of 0.05 to 1 N/20 mm for a 25 μm thick polyethylene terephthalate (PET).

3. The flat panel detector, as described in the foregoing 1 or 2, wherein the releasable adhesive layer contains at least a rubber resin or an acryl resin.

4. The flat panel detector, as described in any of the foregoing 1 to 3, wherein the scintillator comprises the phosphor layer which is provided on the substrate by a process of gas phase deposition.

5. The flat panel detector, as described in any of the foregoing 1 to 4, wherein the protective layer comprises a resin film.

6. The flat panel detector, as described in the foregoing 5, wherein the resin film exhibits a thickness of 1 to 200 μm.

7. The flat panel detector, as described in any of the foregoing 1 to 6, wherein the substrate is a polyimide (PI) or polyethylene naphthalate (PEN) film.

8. The flat panel detector, as described in any of the foregoing 1 to 7, wherein a total thickness of the scintillator panel is not more than 1 mm.

9. The flat panel detector, as described in any of the foregoing 1 to 8, wherein the phosphor layer is comprised of CsI (cesium iodide).

EFFECT OF THE INVENTION

According to the present invention, there can be provided a flat panel detector which prevents aging deterioration of characteristics of a phosphor layer, protects the phosphor layer from chemical alteration or physical impact, and maintains a stable contact state between the scintillator panel and the flat light receiving element.

BRIEF DESCRIPTION OF THE DRAWING

FIG. 1 illustrates constitution of a flat panel detector of the invention.

DESCRIPTION OF DESIGNATIONS

1: Flat panel detector
11: Housing
12: Scintillator panel
121: First protective film
122: Phosphor layer
123: Substrate
124: Second protective film
125: Releasable adhesive layer
13: Light receiving element
14: Protective cover
15: Cushioning layer

PREFERRED EMBODIMENTS OF THE INVENTION

As a result of extensive study by the inventors of this application to solve the foregoing problems, it was found that the problems could be overcome by providing a releasable adhesive layer on a protective layer covering the phosphor surface. Providing a releasable adhesive layer exhibiting slight adhesiveness effectively prevents displacement of the scintillator panel surface and the flat light receiving surface, and in repair or scintillator replacement, the scintillator panel is separable from the flat light receiving element surface without damaging the light receiving element surface.

Releasable Adhesive Layer

In the invention, the adhesive force of a releasable adhesive layer is preferably from 0.05 to 1 N/200 mm for a 25 μm thick polyethylene terephthalate (PET). An adhesive force of not less than 0.05 N/20 mm is greatly effective in prevention of displacement of the scintillator panel surface and the flat light receiving element surface, and an adhesive force of not more than 1 N/20 mm preferably gives little damage to the light receiving element. Generally, a flat light receiving element is formed on a glass substrate or silicon substrate and it is difficult to precisely measure the adhesive force of a releasable adhesive layer onto the protective layer of a scintillator. In the invention, the adhesive force of a releasable adhesive layer was evaluated in terms of adhesive force to a 25 μm thick polyethylene terephthalate (PET). It is known that the temperature of a light receiving element is increased to about 50° C. on continuous use of the FPD. In cases when compressing a scintillator panel onto a light receiving element through a cushioning layer, its compression force is generally an extent of 10 gf/cm² (0.98 N/cm²).

In the invention, the adhesive force refers to a releasing force after being thermally aged at 50° C. for 7 days, while the releasing adhesive layer and polyethylene terephthalate (PET) being in close contact with each other under a pressure of 100 gf/cm² (0.98 N/cm²). Specifically, a value which is measured at a releasing rate of 90 inch/minute (approximately 229 cm/min) and a releasing angle of 90°, is preferably from 0.05 to 1 N/20 mm.

A releasable adhesive layer may be one exhibiting releasability capable of releasing a scintillator panel without destroying the flat light-receiving element. An adhesive layer exhibiting such releasability can employ an adhesive resin of acryl, silicone or rubber.

An adhesive rubber resin can employ a block copolymer such as styrene-isoprene-styrene copolymer, a synthetic rubber adhesive such as polybutadiene, polybutylene or the like and a natural rubber.

A silicone adhesive may employ a peroxide-curing type or addition condensation type in the form of a simple substance or a mixture thereof. There may be mixedly employed an acryl adhesive and a rubber adhesive. There may also be employed an adhesive in which a silicone component is attached to a polymeric backbone or side-chain of an acryl adhesive.

In cases when using an aryl resin as an adhesive, it is preferred to employ a resin obtained by reaction of a radical-polymerizable monomer containing, as a monomer component, an acrylic acid ester having an alkyl side chain of one to fourteen carbon atoms.

Examples of such an acrylic acid ester having an alkyl side chain of one to fourteen carbon atoms include (1st group): methyl acrylate, ethyl acrylate, n-propyl acrylate, iso-propyl acrylate, n-butyl acrylate, sec-butyl acrylate, t-butyl acrylate, n-hexyl acrylate, cyclohexyl acrylate, n-octyl acrylate, iso-octyl acrylate, 2-ethylhexyl acrylate, iso-nonyl acrylate, iso-decyl acrylate, lauryl acrylate, methyl methacrylate, ethyl methacrylate, n-propyl methacrylate, iso-propyl methacrylate, n-butyl methacrylate, sec-butyl methacrylate, t-butyl methacrylate, n-hexyl methacrylate, cyclohexyl methacrylate, n-octyl methacrylate, iso-octyl methacrylate, 2-ethylhexyl methacrylate, iso-nonyl methacrylate, iso-decyl methacrylate, and lauryl methacrylate. Of these, it is preferred to employ a methacrylic acid alkyl ester having an alkyl chain of 4 to 9 carbon atoms or an acrylic acid alkyl ester having an alkyl chain of 4 to 9 carbon atoms. It is more preferred to employ a methacrylic acid alkyl ester having an alkyl chain of 4 to 9 carbon atoms.

It is also preferred to add, as a monomer component, an acrylic acid ester having a side chain with a polar group such as a hydroxyl group, a carboxyl group or an amino group.

Examples of a monomer containing a hydroxyl group include (2nd group): 2-hydroxyethyl (meth)acrylate, 4-hydroxybutyl (meth)acrylate, 6-hydroxyhexyl (meth)acrylate, hydroxypropyl (meth)acrylate, caprolactone-modified (meth)acrylate, polyethylene glycol mono(meth)acrylate, and polypropylene glycol (meth)acrylate. Of these are preferred 4-hydroxybutyl (meth)acrylate, and 6-hydroxyhexyl (meth)acrylate.

Examples of a monomer having a polar group other than a hydroxyl group include (3rd group): a monomer having a carboxyl group, such as acrylic acid, methacrylic acid, itaconic acid, maleic acid, crotonic acid, a acrylic acid dimer, and ethylene oxide-modified succinic acid acrylate; a monomer having a an amide group, such as n-vinyl-2-pyrrolidone, N-vinyl caprolactam, acryloyl morphorine, acryl amid, N,N-dimethyl acryl amide, and 2-(perhydrophthalimide-N-yl) ethyl acrylate; acrylonitrile, maleic acid anhydride and itaconic acid anhydride.

In the invention, a releasable adhesive layer preferably contains at least a rubber resin or acryl resin.

Protective Layer

JP 2000-56694A discloses a protective film used for an image plane which comprises a laminate formed of a rubber layer provided on one side of a transparent film layer exhibiting a light transmittance of 80% or more, and the laminate exhibiting a light transmittance of 80% or more. The rubber layer is formed of one rubber selected from the group consisting of silicone rubber, fluorinated rubber, acryl rubber, ethylene propylene rubber and acryl nitrile butadiene rubber, or a rubber mixture of two or more of the foregoing rubbers. These are suitable for the flat panel detector of the invention.

Any protective layer for a scintillator, which is capable of forming a releasable adhesive layer, can achieve effects of the invention but a resin film is preferred in terms of easiness of coating the releasable adhesive layer. Effects of the invention can be readily achieved by sealing a scintillator with a resin film which was previously coated with a releasable adhesive layer.

In the invention, when employing a resin film for a protective layer, the thickness of such a protective film is preferably from 12 to 200 μm. A film of more than 200 μm results in lowered resolution and a film of less than 12 μm is insufficiently durable for physical contact.

Substrate

With respect to the fact that sticking a scintillator panel onto the flat light-receiving element surface was affected by deformation or bending at the time of deposition and a uniform image characteristic was not achieved within the light receiving face of a flat panel detector, it was found that the use of a 50-500 μm thick polymer film for the substrate and a total thickness of the scintillator panel of not more than 1 mm enabled to deform the scintillator panel to a form fitted to the form of a flat light-receiving element, whereby uniform sharpness was achieved within the overall light-receiving surface of the flat panel detector.

A polymer film used for the substrate preferably is a polyimide (PI) or polyethylene naphthalate (PEN) film in terms of heat resistance during deposition.

In the following, the embodiment of the invention will be described with reference to the drawing, but are by no means limited to this.

FIG. 1 illustrates a configuration diagram of flat panel detector 1 of the invention. The flat panel detector 1 is provided, within a housing 11, with a scintillator panel 12 which instantaneously exhibits fluorescence at an intensity corresponding to a dose of radiation transmitted through the subject, a light receiving element 13 which is provided in contact with the scintillator panel 12 and in which plural light receiving pixels capable of photoelectric-converting light from the scintillator panel 12 are two-dimensionally disposed, a protective cover 14 to protect the scintillator panel 12 and a cushioning layer 15 as a cushioning member.

In the scintillator panel 12, a phosphor layer 122 is formed on a substrate 123, and the substrate 123 and the phosphor layer 122 are sealed with a first protective film 121 and a second protective film 124.

The substrate 123 is formed of a material capable of transmitting radiation. The substrate 123 preferably is flexible so that the scintillator panel 12 is closely in contact with the surface of the light receiving element 13. For example, a 124 µm thick, flexible polyimide film is usable. There are also usable cellulose acetate film, polyester film, polyethylene terephthalate film, polyethylene naphthalate film, polyamide film, triacetate film and polycarbonate film other than polyimide film. A thickness id preferably from 50 to 500 µm.

The phosphor layer 122 is constituted of a phosphor layer with a high columnar structure which has light guide effect and achieves enhanced emission efficiency. The phosphor layer is formed preferably by a process of a gas phase deposition. For instance, a phosphor material of cesium iodide (CsI) added with thallium (Tl) as an activator is subjected to vacuum deposition to form a phosphor layer with a columnar crystal structure. There is also usable cesium bromide (CsBr) other than cesium iodide (CsI). There are also usable, as an activator, europium, indium, lithium, potassium, rubidium, sodium, copper, cerium, zinc, titanium, gadolinium and terbium other than thallium (Tl). The thickness of the phosphor layer is preferably from 100 to 800 µm, and a thickness of 120 to 700 µm is more preferred to achieve balanced characteristics of luminance and sharpness.

The cushioning layer 15 allows the scintillator panel 12 to be in contact with the light receiving element 12 under an appropriate pressure. There is usable silicone or urethane foam material. The thickness of a cushioning layer is preferably from 1 to 40 mm, and more preferably from 2 to 20 mm.

The first protective film 121 and the second protective film 124, which protect the phosphor layer 122 from moisture to inhibit deterioration of the phosphor layer 122, are formed of film exhibiting low moisture permeability. For example, polyethylene terephthalate film (PET) is usable. There are also usable polyester film, polymethacrylate film, nitrocellulose film, cellulose acetate film, polypropylene film and polyethylene naphthalate film, other than PET.

Further, on the opposed surfaces of the first protective film 121 and the second protective film 124 is formed a fusing layer which melts to seal both of them.

A releasable adhesive layer 125 is formed on the first protective film 121 of the side in contact with the light receiving element.

The light receiving element 13 is constituted of light receiving pixels which are two-dimensionally arranged and are formed of for example, "photodiode+thin film transistor (TFT)". A signal charge which has been photo-electrically converted is read by using TFT. There are also usable CMOS and CCD as the light receiving element 13.

The protective cover protects the scintillator panel 12 from external impact or the like and also plays a role of allowing the scintillator panel 12 to be pressed onto the light-receiving element 13 at an appropriate pressure by compressing the cushioning layer 15. Such a protective cover is constituted of a carbon plate exhibiting a high radiation transmittance. There is also usable aluminum plate as the protective cover 14.

In assembling the flat panel detector 1, the scintillator panel 12, which is sealed with the first protective film 121 provided thereon with the releasable adhesive layer 125, is placed on the light receiving element 13 disposed within the housing 11, and further thereon, the cushioning layer 15 is placed and the protective cover 14 is fixed to the housing 11 by screws or the like. When fixing the protective cover 14, the cushioning layer 15 is compressed and the repulsion force of the cushioning layer 15 repulsive to compression allows the scintillator panel 12 to be pressed onto the light receiving element 13 at an appropriate pressure. The releasable adhesive layer 12 formed on the first protective film 121 is adhered to the light receiving element 13 by this pressure to prevent displacement of the scintillator panel 12 and the light receiving element 13, caused by vibration or inclination of the flat panel detector.

The substrate 123 is formed of a 120 µm or less thick resin film and the total thickness of the scintillator panel 12 is 1 mm or less so that the scintillator panel 12 is deformed to the shape fitted to the facial shape of the flat light receiving element 12 by optimal pressure of the cushioning layer 15, whereby a uniform contact state is achieved over all of the light receiving surface of a flat panel detector.

Thus, according to the embodiment of the invention, an excellent close-contact state of the scintillator panel 12 and the light receiving panel 13 is achieved by the optimal pressure of the cushioning layer 15 without damaging the phosphor layer 122. This operation is performed simply by placing the scintillator panel 12 on the light receiving element 13 and fixing the cushioning layer 15 and the protective cover 14 so that assembling is performed precisely and easily.

In this embodiment of the invention, two sheets of protective film of the first protective film 124 and the second protective film 125 are used but even in cases when a protective layer is one other than resin film, such as poly-p-xylylene membrane formed on the overall surface of a scintillator panel by a process of CVD, effects of the invention can be realized by the similar procedure.

EXAMPLES

The present invention will be specifically described with reference to examples but is not limited to these. In the examples, expression of "%" represents "% by mass" unless otherwise noted.

Example

Preparation of Scintillator Plate
Preparation of Substrate:
  There were prepared 125 µm and 225 µm thick polyimide films (250×300 mm).
Formation of Phosphor Layer:
  Using a vapor deposition apparatus, a phosphor (CsI:0.3% Tl) was formed on prepared polyimide film by a process of vapor deposition to prepare a scintillator, as described below.
  A phosphor raw material (CsI:0.3% Tl) was loaded into a resistance heating crucible, polyimide film was set on a supporting holder, and the distance between the resistance heating crucible and an aluminum plate was adjusted to 400 mm. Subsequently, the interior of the vapor deposition apparatus was evacuated and after argon gas was introduced thereto and the vacuum degree was adjusted to 0.5 Pa, the temperature was maintained at 150° C., while rotating the polyimide film at a rate of 10 rpm. Subsequently, the resistance heating crucible was heated to allow the phosphor to be deposited and when the phosphor layer thickness reached 400 µm, deposition was terminated to prepare a scintillator.
Preparation of Scintillator Panel
Preparation of Protective Film:
  There was prepared a 43 µm thick laminated film, as a protective film (denoted as protective film A), as described below. Using a two-component reaction type urethane adhesive, lamination was conducted through dry lamination at an adhesive thickness of 1 μm.

Protective film A: PET (12 μm)/CPP (30 μm), thickness of 43 μm

Protective film B: PET (100 μm)/CPP (30 μm), thickness of 131 μm

Protective film C: PET (180 μm)/CPP (30 μm), Thickness of 211 μm

Releasable Adhesive Layer:

An aromatic isocyanate compound (B) was added in an amount shown in Table 1 to an acryl copolymer of 100 parts by mass of mixture (A) at a solid ratio, as shown below. Further, 60 ppm of dioctyl tin dilaurate, based on solid content was added thereto and diluted with ethyl acetate to obtain a releasable adhesive composition of 30% solid content.

| (A) | |
|---|---|
| 2-Ethylhexyl acrylate | 50 parts by mass |
| Butyl acrylate | 30 parts by mass |
| Styrene | 19 parts by mass |
| 2-Hydroxyethyl methacrylate | 3 parts by mass |
| (B) | |
| Tolylene diisocyanate/trimethylol propane adduct (trade name: Coronate L produced by Nippon Polyurethane Industry. Co., Ltd.) | |

On the PET face side of the prepared protective film was coated the releasable adhesive composition so that a dry layer thickness was 10 μm, and the coated layer was dried at 80° C. for 90 sec. by a heated air-cycling dryer to form a releasable adhesive layer, which was further subjected to a heating treatment at 40° C. for 5 days to form a releasable adhesive layer on the foregoing protective film.

A comparative sample was prepared in the same manner as in the foregoing, except that the releasable adhesive composition was not coated on the protective film.

Preparation of Scintillator Panel:

A protective film having a releasable was provided on the phosphor layer side of the scintillator and the same protective film as the phosphor side, except for having no releasable adhesive layer was provided on the substrate side, and opposed CPP resin layers at the peripheral portions were fused by using an impulse sealer, whereby a scintillator panel was prepared. Fusion was performed so that the distance from the fused portion to the periphery of the phosphor sheet was 1 mm. The impulse heater used for fusion was 3 mm wide.

Measurement of Peeling Power:

A 25 μm thick polyethylene terephthalate (PET) sheet of 200×20 mm was adhered to a scintillator panel under a pressure of 10 kPa and subjected to a heating treatment at 70° C. for 7 days. Thereafter, the polyethylene terephthalate (PET) was peeled and an average value of forces required when peeling the PET at a peeling rate of 90 inches/min (about 229 cm/min) and a peeling angle of 90 degrees was defined as the adhesive strength.

Evaluation of Scintillator Panel

The thus prepared scintillator panels were evaluated, as below.

Evaluation of Graininess:

The scintillator panel and the cushioning member formed of a 12 mm thick urethane foam were successively set on the surface of a light receiving element of Pax Scan 2520 (FPD produced by Varian Co.), and a protective cover formed of a carbon plate was fitted thereon so that the scintillator panel was pressed onto the light receiving element at a pressure of 100 gf/cm$^2$ (0.98 N/cm$^2$) by the pressure of the compressed cushioning member.

An FPD having set the foregoing scintillator was fitted to a vibration testing machine and the radiation incident surface side of the FPD was exposed to X-rays of 3.0 mR at a tube voltage of 70 kVp to conduct output correction (grain correction) of the individual pixels forming a light receiving element. Then, after vibrations of 25 Hz (1.2 G) was given to the FPD over 10 sec. by the vibration testing machine, the FPD was exposed to X-rays of 0.1 mR at a tube voltage of 70 kVp, the image data from the FPD were detected and recorded on a hard disc. Subsequently, the record on a hard disc was analyzed by a computer and the expression "20×log$_{10}$(S/N) dB" was calculated, in which S represented the average value of electric signals of image signals and N represented the square root value of an square average of signals (noises) deviated from the average intensity S. Graininess was evaluated based on this calculated value. Graininess was represented by a relative value, based on the graininess of scintillator panel 12 (comparison) being zero.

Evaluation of Sharpness:

Similarly to the foregoing evaluation of graininess, the FPD was exposed to X-rays at a tube voltage of 70 kVp through a lead MTF chart and the image data was recorded on a hard disc. Then, the record on the hard disc was analyzed by a computer to determine a modulation transfer function, MTF [MTF value (%) at a spatial frequency cycle of 1/mm], which was a measure of sharpness. A higher MTF value indicates superior sharpness. "MTF" is the abbreviation for Modulation Transfer Function. The MTF was an average value at five portions within the effective image region of the FPD.

Evaluation of Maintenance:

After completion of the foregoing evaluation of graininess, the FDP was allowed to stand for 100 hrs under an environment of 40° C. and 50% RH, while the power was on; then, the protective cover was removed and the scintillator panel was taken out from the FDP and visually evaluated. In the evaluation result, a scintillator panel having damage on the light receiving element surface was denoted as "B" and one having no damage was denoted as "A".

Evaluation results regarding adhesion strength of a releasable adhesion layer and graininess, sharpness and maintenance of a scintillator panel are shown in Table 1.

TABLE 1

| Scintillator Panel No. | Substrate Thickness (μm) | Protective Film Thickness (μm) | Releasable Adhesive Layer (μm) | Scintillator Panel Thickness (μm) | Coronate L (part by mass) | Adhesion Strength (N/200 mm) | Graininess | Sharpness (MTF) | Maintenance Property | Remark |
|---|---|---|---|---|---|---|---|---|---|---|
| 1 | 125 | 43 | 10 | 621 | 25 | 0.03 | 1.0 | 0.60 | A | Inv. |
| 2 | 125 | 43 | 10 | 621 | 20 | 0.05 | 1.5 | 0.66 | A | Inv. |
| 3 | 125 | 43 | 10 | 621 | 15 | 0.3 | 1.5 | 0.66 | A | Inv. |
| 4 | 125 | 43 | 10 | 621 | 10 | 0.5 | 1.5 | 0.66 | A | Inv. |
| 5 | 125 | 43 | 10 | 621 | 5 | 1 | 1.5 | 0.66 | A | Inv. |

TABLE 1-continued

| Scintillator Panel No. | Substrate Thickness (μm) | Protective Film Thickness (μm) | Releasable Adhesive Layer (μm) | Scintillator Panel Thickness (μm) | Coronate L (part by mass) | Adhesion Strength (N/200 mm) | Graininess | Sharpness (MTF) | Maintenance Property | Remark |
|---|---|---|---|---|---|---|---|---|---|---|
| 6 | 125 | 43 | 10 | 621 | 2 | 2 | 1.5 | 0.66 | A | Inv. |
| 7 | 125 | 131 | 10 | 797 | 15 | 0.3 | 1.6 | 0.64 | A | Inv. |
| 8 | 125 | 211 | 10 | 957 | 15 | 0.3 | 1.6 | 0.57 | A | Inv. |
| 9 | 225 | 43 | 10 | 721 | 15 | 0.3 | 1.5 | 0.66 | A | Inv. |
| 10 | 225 | 131 | 10 | 897 | 15 | 0.3 | 1.6 | 0.64 | A | Inv. |
| 11 | 225 | 211 | 10 | 1057 | 15 | 0.3 | 1.6 | 0.53 | A | Inv. |
| 12 | 125 | 43 | none | 611 | — | 0 | 0.0 | 0.51 | A | Comp. |

From the Table, it was proved that scintillator panels of the invention were superior in graininess and sharpness, compared to a comparative example and maintenance was also good.

What is claimed is:

1. A flat panel detector comprising:
a scintillator panel comprising a scintillator provided with a phosphor layer on a substrate and
a protective layer covering a phosphor surface of the scintillator, and
the scintillator panel being placed on a surface of a flat light receiving element comprising plural light receiving pixels which are two-dimensionally arranged,
wherein a releasable adhesive layer is provided on a surface of the protective layer such that the releasable adhesive layer is between the protective layer and the light-receiving element and releasably adheres the scintillator panel to the light receiving element, and
wherein a total thickness of the scintillator panel is not more than 1 mm.

2. The flat panel detector as claimed in claim 1, wherein The releasable adhesive layer exhibits an adhesive strength of 0.05 to 1 N/20 mm for a 25 μm thick polyethylene terephthalate (PET).

3. The flat panel detector as claimed in claim 1, wherein the releasable adhesive layer contains at least a rubber resin, a silicone resin or an acryl resin.

4. The flat panel detector as claimed in claim 1, wherein the scintillator comprises the phosphor layer which is provided on the substrate by a process of gas phase deposition.

5. The flat panel detector as claimed in claim 1, wherein the protective layer comprises a resin film.

6. The flat panel detector as claimed in claim 5, wherein The resin film exhibits a thickness of 1 to 200 μm.

7. The flat panel detector as claimed in claim 1, wherein the substrate is a polyimide (PI) or polyethylene naphthalate (PEN) film.

8. The flat panel detector as claimed in claim 1, wherein the phosphor layer is comprised of CsI (cesium iodide).

9. the flat panel detector as claimed in claim 1, wherein the protective layer comprises a poly-p-xylylene membrane.

* * * * *